USOO6124797A

United States Patent [19]
Mercado

[11] Patent Number: 6,124,797
[45] Date of Patent: Sep. 26, 2000

[54] BACKUP BATTERY MONITORING DEVICE AND METHOD

[76] Inventor: Luis Bernardo Mercado, 2301 Aldersgate Ct., Turlock, Calif. 95382

[21] Appl. No.: 09/245,704

[22] Filed: Feb. 6, 1999

[51] Int. Cl.[7] .................................................. G08B 21/00
[52] U.S. Cl. ............................................. 340/636; 320/48
[58] Field of Search ................................. 340/636, 661, 340/645, 635; 320/48, 30

[56] References Cited

U.S. PATENT DOCUMENTS

| | | | |
|---|---|---|---|
| 3,593,132 | 7/1971 | Houck et al. | 324/102 |
| 4,138,670 | 2/1979 | Schneider et al. | 340/507 |
| 4,316,133 | 2/1982 | Locke, Jr. | 320/48 |
| 4,441,066 | 4/1984 | Burmenko | 320/48 |
| 4,618,857 | 10/1986 | Dubois et al. | 340/654 |
| 4,820,965 | 4/1989 | Siemer | 320/31 |
| 4,929,931 | 5/1990 | McCuen | 340/636 |
| 5,047,961 | 9/1991 | Simonsen | 364/550 |
| 5,457,377 | 10/1995 | Jonsson | 320/5 |
| 5,744,932 | 4/1998 | Kissel | 320/48 |

*Primary Examiner*—Jeffery A. Hofsass
*Assistant Examiner*—Sihong Huang
*Attorney, Agent, or Firm*—Risto A Rinne, Jr.

[57] ABSTRACT

An apparatus and method for determining the efficacy of the backup batteries connected in series that are used to supply electrical power to a load in the event of an interruption of an AC electrical input power source which normally supplies electrical power to the load and maintains the backup batteries in a state of ready charge includes measuring the AC ripple voltage across a minimum of one of the backup batteries and comparing the AC ripple voltage to a minimum and a maximum threshold. In the event the AC ripple voltage exceeds the maximum threshold an alarm is activated to indicate that a failure of at least one of the backup batteries has occurred and is in need of servicing. In the event the AC ripple voltage falls below the minimum threshold a determination is made as to whether the backup batteries are supplying electrical power to the load. If they are supplying power, then the loss of AC ripple is expected under this condition and the backup batteries are assumed to be functioning properly. However, if the backup batteries are not supplying power to the load, the alarm is activated to indicate that a failure of at least one of the backup batteries has occurred and is in need of servicing. Methods of establishing the minimum and maximum threshold values are discussed including ways of automatically establishing the thresholds when the AC ripple voltage is measured across a minimum of two of the backkup batteries.

20 Claims, 2 Drawing Sheets

BACKUP BATTERY MONITORING DEVICE AND METHOD

BACKGROUND OF THE INVENTION

1. Field of the Invention

The present invention, in general relates to backup battery monitoring devices and, more particularly, to devices and methods for determining the state of a backup battery.

Backup batteries are used for a variety of purposes. An important application involves the use of an uninterruptible power supply (or system), sometimes also known by the acronym "UPS".

An uninterruptible power supply may require many batteries to be placed in series to supply the necessary voltage and current. Such placement of a group of batteries in series is referred to as a battery "string". Additional battery "strings" may also be arranged in parallel so as to provide added backup time in the event of a power failure or to provide a fail-safe level of redundancy.

It is well known that if one of the batteries should fail, in particular if it should fail by developing an electrical open, then the uninterruptible power supply cannot function in the event of a loss of primary electrical power (if only one string is present). At a minimum, backup time will be reduced. This is also true if the failure involves a short occurring within one of the batteries.

As a result, periodic labor-intensive testing is done to verify the condition of the backup batteries. Alternatively, circuits have been invented to measure the status of the backup batteries, but these have proven either to be expensive to purchase, difficult to install, or marginal in performance.

Accordingly there exists today a need for an apparatus and method that is inexpensive, easy to install, and effective at determining the status of backup batteries.

Clearly, such an apparatus and method is a useful and desirable.

2. Description of Prior Art

Battery verification devices are, in general, known. For example, the following patents describe various types of these devices:

U.S. Pat. No. 4,138,670 to Schneider et al, Feb. 6, 1979;
U.S. Pat. No. 4,316,133 to Locke, Jr., Feb. 16, 1982;
U.S. Pat. No. 4,441,066 to Burnenko, Apr. 3, 1984;
U.S. Pat. No. 4,618,857 to Dubois et al, Oct. 21, 1986;
U.S. Pat. No. 4,820,965 to Siemer, Apr. 11, 1989;
U.S. Pat. No. 4,929,931 to McCuen, May 29, 1990;
U.S. Pat. No. 5,047,961 to Simonsen, Sep. 10, 1991;
U.S. Pat. No. 5,457,377 to Jonsson, Oct. 10, 1995; and
U.S. Pat. No. 5,744,932 to Kissel, Apr. 28, 1998.

While the structural arrangements of the above described devices, at first appearance, have similarities with the present invention, they differ in material respects. These differences, which will be described in more detail hereinafter, are essential for the effective use of the invention and which admit of the advantages that are not available with the prior devices.

OBJECTS AND SUMMARY OF THE INVENTION

It is an object of the present invention to provide a backup battery monitoring device and method that is easy to install.

It is also an important object of the invention to provide a backup battery monitoring device and method that is inexpensive.

Another object of the invention is to provide a backup battery monitoring device and method that is adaptable for use in a variety of existing systems.

Still another object of the invention is to provide a backup battery monitoring device and method that relies upon the AC ripple produced by the rectifier, for example, of an uninterruptible power supply.

Still yet another object of the invention is to provide a backup battery monitoring device and method that generates fewer false-alarm indications.

Yet another important object of the invention is to provide a backup battery monitoring device and method that does not generate an alarm condition indicating a battery failure when the primary AC input power is lost.

Briefly, a backup battery monitoring device and method that is constructed in accordance with the principles of the present invention includes measuring the AC ripple voltage across a minimum of one battery. If the ripple voltage should exceed or fall below a threshold level, which can be set (programmed) for the battery type and specific installation, an alarm is activated providing the AC input power is active or the backup batteries are not being used to supply power for a load. Ideally a microprocessor is used along with electrical circuitry to accomplish all of the functions desired. Various methods for calibrating the device are also disclosed. A minimum of two and, ideally, three backup batteries are monitored in a string for autocalibration of the ripple threshold values to occur.

DETAILED DESCRIPTION OF THE INVENTION

Figure 1:
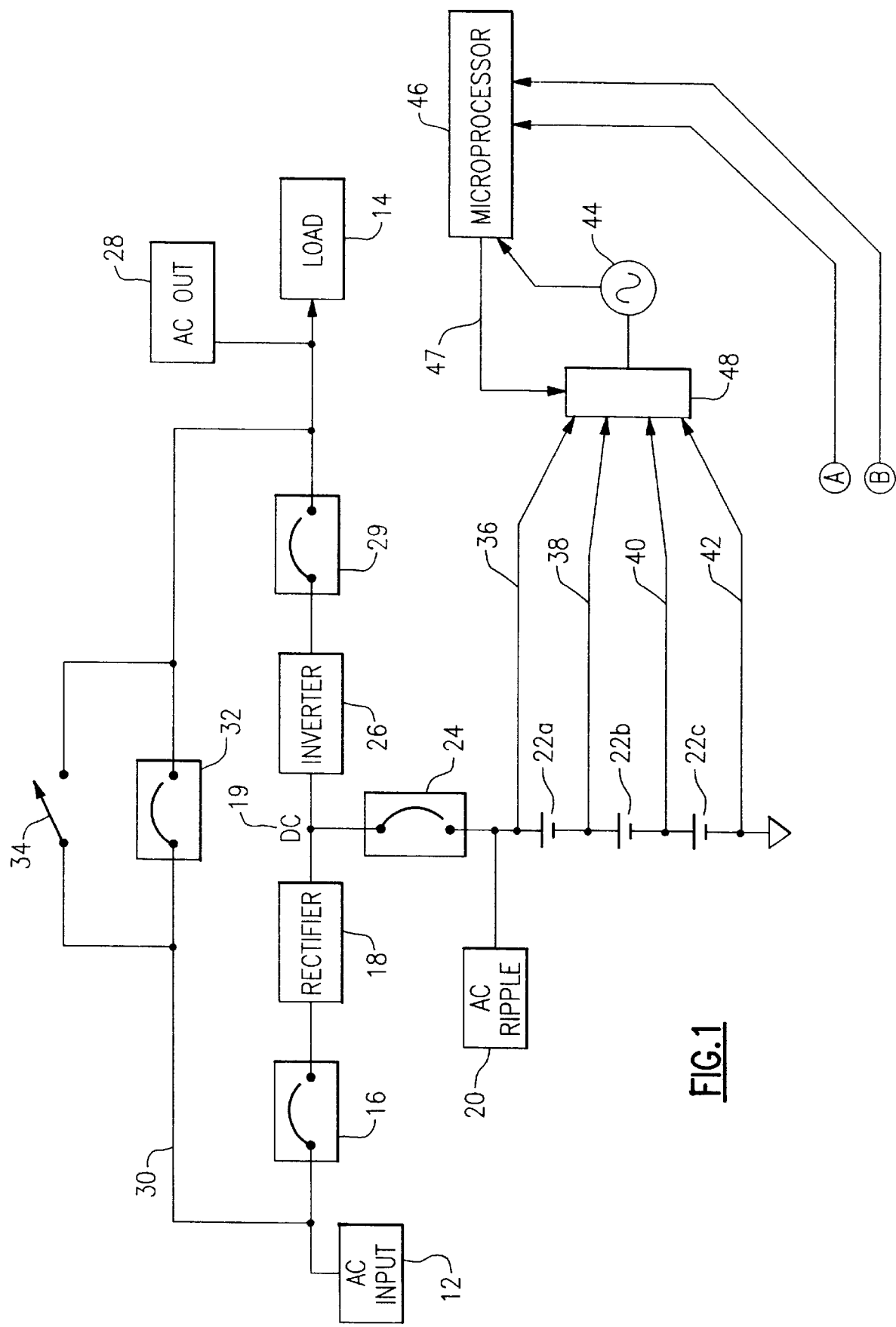
FIG. 1 is a block diagrammatic view of an uninterruptible power supply with backup battery monitoring device and method connected thereto.

Referring to FIG. 1 is shown, an uninterruptible power supply which includes an AC input 12 that supplies the alternating voltage and current as required by a load 14. Any magnitude of voltage and current may constitute the AC input 12 as well as any frequency of oscillation.

An input circuit breaker 16 is used to isolate the AC input 12 from a rectifier 18 as needed for servicing or during use if an overcurrent condition occurs. The rectifier 18 converts the alternating voltage and current of the AC input 12 into a direct voltage and current output hereinafter referred to as "DC output" and identified by the reference numeral 19.

Typically the DC output 19 of the rectifier 18 is not a pure DC source but still includes a small AC ripple voltage and current as well. If one were to look at the voltage waveform of the DC output 19 on an oscilloscope (not shown) one would see a DC voltage that also includes a small wave. The wave is the AC ripple. The AC ripple induces an AC ripple voltage and current 20 that is applied across a string of backup batteries 22a, 22b, and 22c.

A battery breaker 24 isolates the string of backup batteries 22a–c in a manner similar to that of the input breaker 16.

The DC output 19 is used to charge and then to maintain the charge of the backup batteries 22a–c. The DC output 19 also is used to supply input power for an inverter 26. The backup batteries 22a–c also supply back the DC output 19 voltage and current as the input for the inverter 26, especially during a loss of the AC input 12. The inverter 26 normally uses the DC output 19 as its input and converts it back into an AC output 28 that matches the frequency, voltage, and current capacity (power) the AC input 12. Some UPS's even synchronize the phase of the output waveform of the inverter to match that of the AC input 12, therefore making switching between the two appear transparent to the load 14.

It is variable system to system as to the quantity of the actual current that is supplied to the inverter 26 during normal operation that comes directly from the DC output 19 and what, if any, from the backup batteries 22a–c. Generally, the DC output 19 is of such magnitude as to handle the requirements of the inverter 26, and therefore the load 14, while also having an excess capacity that is able to charge and maintain the charge of the backup batteries 22a–c during operation. Therefore, the backup batteries 22a–c, under normal operation, do not supply the electrical energy that is used by the inverter 26.

However, when there is a failure of the AC input 12 source, a condition that typically occurs when there in an interruption in the flow of electricity supplied by the electrical utility company, then the entire source of electrical power (voltage and current) for the inverter 26 is supplied by the backup batteries 22a–c. As is well known in the arts relating to uninterruptible power supplies, there is no interruption to the electrical power that is supplied to the load 14 during such interruptions providing all components of the uninterruptible power supply are functioning properly.

An output breaker 29 similarly isolates the output of the inverter 26 from the load 14. A bypass loop 30 includes a bypass breaker 32 and a static switch 34 around the bypass breaker 32. The static switch 34 in conjunction with the input breaker 16 and output breaker 28 can be used to supply the AC input 12 direct to the load and to isolate the rectifier 18, backup batteries 22a–c, and inverter 26 for testing or repair purposes.

What has been described thus far represent the component parts that comprise the uninterruptible power supply and what is generally known about the construction of uninterruptible power supplies. Typically, the uninterruptible power supply will include a much larger quantity than the three backup batteries 22a–c shown. The backup batteries 22a–c are electrically connected in series to provide a "string" of batteries (not shown) with a voltage and current capacity sufficient to meet the requirements of the load 14.

As was discussed above the AC ripple 20 is a by-product of the rectifier 18. The process of rectifying AC, that is changing an alternating source of electrical energy into a direct source, is not perfect. The imperfection manifests as the AC ripple 20. Generally the more sophisticated the rectifier 18, the smaller is the quantity of the AC ripple 20 that is produced, but some is always present when the AC input 12 is also present.

When the AC input 12 is not present, the rectifier 18 is inoperative, and therefore there is no AC ripple 20 present, such as during electrical power outages. However, under this condition the backup batteries 22a–c are not receiving a charge from the DC output 19 but rather current (direct) is flowing in the opposite direction through the backup batteries 22a–c to supply power for the inverter 26 and the load 14.

A first wire 36 is connected on the positive side of the first backup battery 22a, a second wire 38 is connected intermediate the first battery 22a and the second battery 22b, a third wire 40 is connected intermediate the second battery 22b and the third battery 22c and a fourth wire 42 is connected on the negative (or ground) side of the fourth battery 22c.

These four wires 36–42 are connected to an AC voltmeter 44 that monitors an amount of AC ripple voltage across each of the three batteries. The invention, as described herein can also function if a minimum of any one battery (in any one serial string) are monitored, but three are preferred for systems that include autocalibration, as is discussed in greater detail hereinafter.

The signal the AC voltmeter 44 sees is preferably controlled by a microprocessor 46. The microprocessor 46 includes a control signal 47 that is used by a multiplexor 48 to select which two of the four wires 36–42 reach the AC voltmeter 44. The input to the microprocessor 46 is supplied from the AC voltmeter 44 where the microprocessor 46 can look at the voltage individually across any of the backup batteries 22a–c.

As is well known in the electrical arts, the microprocessor 46 requires a digital representation of the voltage while the voltage is itself an analog quantity. Accordingly, an analog to digital converter is included where desired. It can be part of circuit board (not shown) that contains the microprocessor 46 or it may even be incorporated internal to the microprocessor 46. (If the analog to digital converter is an external component it must, of course, be disposed before the microprocessor 46).

The AC voltmeter 44 is not a critical component in that it provides a signal that is primarily useful for an operator. It is also useful in this disclosure to indicate that the AC ripple voltage is the important parameter that is being compared against a threshold value. It can, if desired, be eliminated from certain applications.

Any of the backup batteries 22a–c, when they fail do so either by shorting internally during which time their internal resistance drops to very nearly zero, or by opening during which time their internal resistance rises substantially to very near infinity. By far the most common failure mode is to open and this failure mode is discussed in greater detail hereinbelow.

Normally the AC ripple 20 voltage will be apportioned evenly across all of the backup batteries 22a–c. If the magnitude is 2 VAC ripple and there are 20 batteries (not shown) in series in the string, then each battery would have about one-tenth of a volt of the AC ripple 20 across it.

When one of the batteries 22a–c does open and its internal resistance rises substantially this causes almost all of AC ripple 20 voltage to be present across that particular battery. Detecting this would show that almost all of the AC ripple 20 (in the example 2 VAC) would be across the battery that failed in this manner. The AC ripple 20 voltage across each of the other cells (batteries) would drop to nearly zero VAC.

To ensure detecting such a failure in the past an elaborate installation monitoring all (twenty) of the batteries was required to guarantee detecting the one battery that had all of the AC ripple 20 (2 VAC) across it.

If a particular battery which fails happens to be any of the backup batteries 22a–c that are being monitored, then a large voltage drop will appear across it providing it fails by developing an electrical open.

Figure 2:
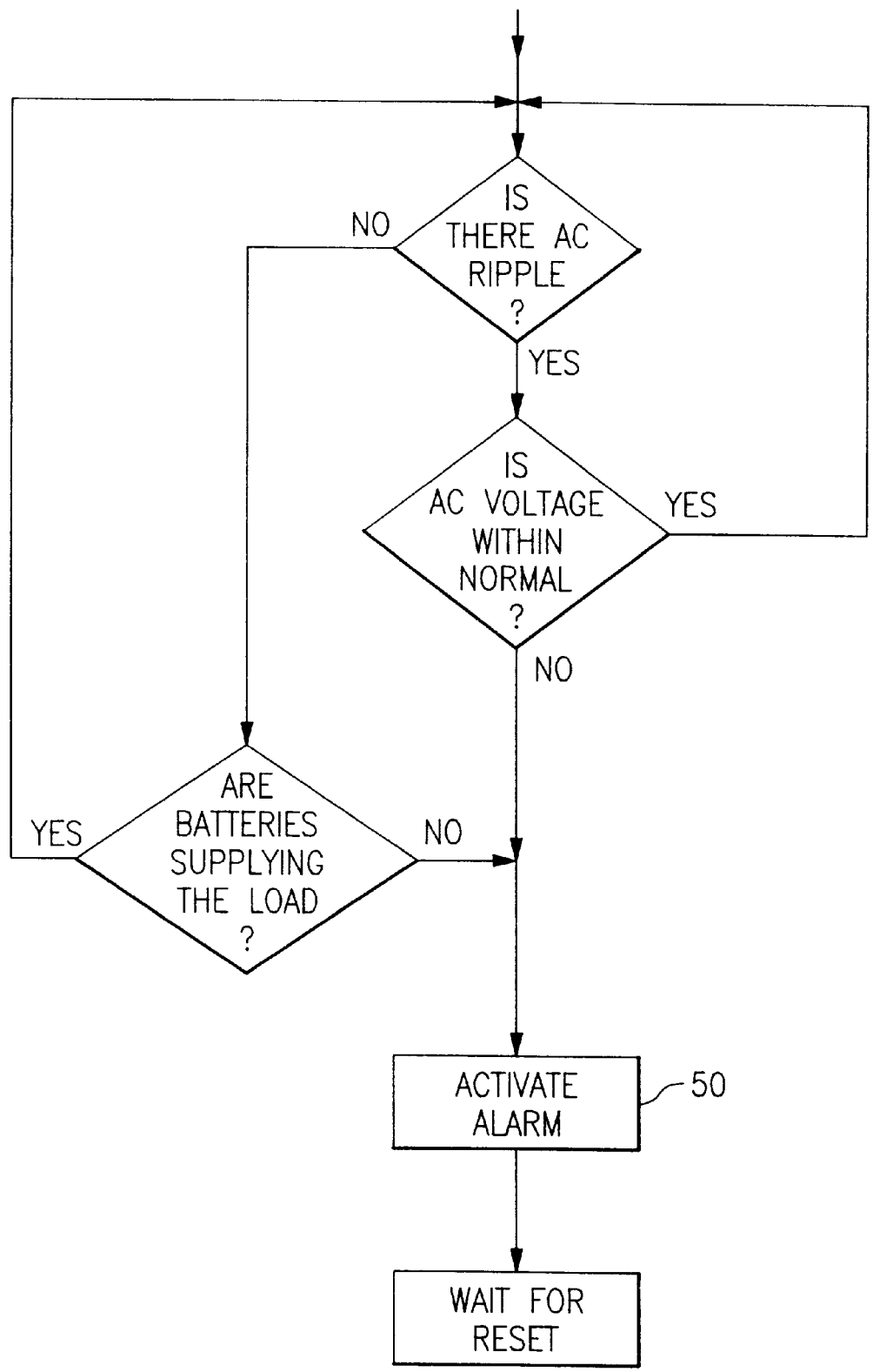
FIG. 2 is a flowchart of the logic path of essential system operations.

Referring now also to FIG. 2, a flowchart of the logic is shown. If conditions are normal then the answer to the first question, "Is there an AC ripple voltage present?" is yes. The second question, "Is it within a normal voltage range?" would also be yes, therefore an idle loop is formed.

If the above condition occurs where a battery fails by developing an open, then coming down the flowchart, the answer to the first question, "Is there an AC ripple voltage present?" would again be yes. If we assume that it is the second battery 22b that has failed by opening internally, the AC ripple 20 would be present and 2 VAC would be present almost entirely across the second battery 22b. For all intent, the AC ripple 20 voltage across the other two batteries (22a and 22c) would drop to zero.

To answer the question "Is it within a normal range?" the answer would be "no" as it would be far too little AC ripple 20 voltage across 22a and 22c and far too great across 22b. Any of these conditions can be detected to confirm that a failure has, in general, occurred. The large voltage drop of AC ripple 20 across the second battery 22b confirms that it is the one that has, in particular, failed.

An alarm 50 is activated by the microprocessor 46 which results in a service call and replacement of the defective battery 22b. The alarm 50 could be anything from something as simple as a light or bell that provides either (or both) a visual and/or an auditory indication (in a low priority installation) or it could be a modem that places a telephone call to a service provider directly and identifies itself and, depending upon the level of sophistication, even the type of failure that has occurred (for a high priority installation). Other telephone calls, such as to key employees can also be accomplished, if desired.

Looking at an alternative path down the flowchart, it is possible that the battery that fails by developing an open will not be one of those that is being monitored. If that happens, then the AC ripple 20 voltage drop that is across the backup batteries 22a–c that are being monitored will all go very nearly to zero.

In this instance, the answer to the first question, "Is there an AC ripple voltage present?" becomes "no" because it has dropped below a predetermined threshold. Setting of the threshold is discussed hereinafter in greater detail. The logic path then requires that a determination be made as to whether the backup batteries 22a–c are supplying the load or not which then becomes the next logical question.

This can be determined in a number of ways. By monitoring the magnitude and direction of direct current through the backup batteries 22a–c it can be determined that the AC input 12 has failed by inference and the backup batteries 22a–c are now supplying the load 14. The loss of AC ripple 20 in this instance does not indicate a failure of any of the batteries. The opposite is true as they are functioning in their intended manner.

Answering yes to the question, "Are the batteries supplying the load?" means that there is no failure of the backup batteries 22a–c (or any of those not shown). Accordingly the logic path is not to generate the alarm 50 condition indicating a battery failure has occurred. If desired, this logical output can, of course, be modified and used to generate a second alarm indicating that a failure of the AC input 12 has occurred. However, detecting this difference is important in preventing unnecessary service calls when the backup batteries 22a–c are in fact operating as they should during a power failure of the AC input 12.

Alternatively the AC voltage at the AC input can be monitored directly to determine whether the backup batteries 22a–c are supplying power for the load. Two additional inputs "A" and "B" are shown to the microprocessor 46. Input "A" is the direction and magnitude of the DC current through the backup batteries 22a–c and input "B" is the AC input 12 condition. Either (or both) of these signals are supplied to the microprocessor 46 so that it can determine if there is a power failure of the AC input 12.

These two factors, the direction and magnitude of the DC current through the backup batteries 22a–c and whether there is AC supply power supplied are normally provided and occasionally monitored by most UPS's and rectifier circuits. Therefore, because most UPS's already provide these signals, the backup battery monitoring device and method as disclosed herein is readily adaptable for use in the production of these types of devices by simple electrical connection to these inputs, "A" and "B".

Returning again to FIG. 2, if the answer to the last question, "Are the batteries supplying the load?" is "no" then the backup batteries 22a–c are not supplying the load. This means that there has not been a failure of the AC input 12. It can then be assumed that one of the backup batteries that is not being monitored has failed by developing an internal open. The AC ripple 20 across the backup batteries 22a–c that are being monitored has fallen to zero (there is little or no AC ripple across them) indicating a failure condition of one of the batteries (not shown) in the string which requires activation of the alarm 50 and warrants probable replacement of at least one of the batteries in the string that, in particular, is not being monitored.

Monitoring at least two of the backup batteries 22a–c allows for verification of the normal amount of the AC ripple 20 that appears across them. By monitoring the AC ripple across at least two of the backup batteries 22a–c they can be compared and averaged to determine a threshold limit.

As is discussed in greater detail hereinafter, if only one backup battery 22a, b, or c is being monitored then it will be necessary to set (via switches or a potentiometer) or to program in memory a predetermined threshold for the variance of the ripple voltage, both for increasing ripple voltage and for decreasing ripple voltage, which when crossed is indicative of a failure (providing, of course that there has not been a lapse in the AC input power).

Returning to the above example if, for example, the difference in the AC ripple 20 voltage drop across the two batteries were to exceed a difference of more than say 20% (0.1 VAC+/−0.02 VAC), it may be assumed that a problem exists in that at least one of the batteries is especially weak. This information can be used to generate a service call to replace a failing battery shortly before it would fail completely, thus preserving the viability of the UPS.

Ideally three batteries are monitored to better determine standard deviation parameters. The AC ripple 20 across the three are averaged and a predetermined threshold value is automatically set by the microprocessor 46 to determine a potential failure condition. The predetermined threshold voltage can either be programmed directly into the operation software (firmware) that controls operation of the microprocessor 46 or it can be a selectable input supplied by switches (not shown) to the microprocessor 46 that a service technician (not shown) would set as part of the calibration procedure when installing this equipment to the UPS.

For example, if the switches are used they can select what variation in AC ripple 20 across each battery is to indicate a failure condition. The switches, if used, could select the desired predetermined percentage of variation in the AC ripple 20 voltage or they could select magnitude directly. For example, they could be used to select a plus or minus 10% difference in AC voltage drop across any of the monitored cells or some other percentage, such as 15% or 20% or otherwise.

Either way, the system as described provides a method to monitor the status of the batteries that is suitable for use with a great variety of uninterruptible power supplies. Installation is easy in that the system is readily calibrated by a technician or it can automatically calibrate itself to determine an acceptable range for the AC ripple 20 across the monitored backup batteries 22a–c. This is accomplished depending upon either internal programming parameters or on selectable switch settings.

At a minimum, as mentioned hereinabove, only one battery need be monitored. For example, if the second wire 38 and the third wire 40 were connected on both sides of the second battery 22b, then it alone could be monitored according to the flowchart of FIG. 2 and the system would function as described hereinabove. However, it would not be possible to autocalibrate the system as there would be no way to automatically determine what is the proper amount of ripple voltage, nor the acceptable variation, that can appear across the second battery 22b.

In this case, either the switches or firmware (a ROM chip [not shown]) would be used to establish these parameters based on predetermined normals for whatever application the system is being used. When the system monitors only one battery (22b according to this example), then there is no need for the multiplexor 48. Accordingly, a less expensive (economical) version of the system is provided that also permits rapid electrical connection to a UPS since, at a minimum, only one battery need be monitored for AC ripple.

The invention has been shown, described, and illustrated in substantial detail with reference to the presently preferred embodiment. It will be understood by those skilled in this art that other and further changes and modifications may be made without departing from the spirit and scope of the invention which is defined by the claims appended hereto.

What is claimed is:

1. A method of monitoring the status of any of a plurality of backup batteries that are normally charged by the output of a rectifier and are electrically connected in series, which comprises:
   (a) measuring the AC ripple voltage across one of said backup batteries;
   (b) comparing the measured AC ripple voltage with a lower threshold level and if the AC ripple voltage falls below said lower threshold level, including the step of determining if said backup batteries are supplying the electrical power to the load and, if said backup batteries are not supplying said electrical power to the load, including the step of generating an electrical signal for activating an alarm to indicate that a failure of at least one of said backup batteries has occurred;
   (c) comparing the measured AC ripple voltage with an upper threshold level and if the AC ripple voltage rises above said upper threshold level, including the step of generating an electrical signal for activating an alarm to indicate that a failure of at least one of said backup batteries has occurred.

2. The method of claim 1 wherein the order of accomplishing steps "b" and "c" are reversed.

3. The method of claim 1 including the step of predetermining said lower threshold level.

4. The method of claim 3 including the step of setting said lower threshold level into a memory that is used by a microprocessor.

5. The method of claim 3 including the step of adjusting the position at least one switch.

6. The method of claim 1 including the step of predetermining said upper threshold level.

7. The method of claim 6 including the step of setting said upper threshold level into a memory that is used by a microprocessor.

8. The method of claim 6 including the step of adjusting the position at least one switch.

9. The method of claim 1 including the step of monitoring said AC ripple voltage across at least one additional one of said backkup batteries.

10. The method of claim 9 including the step of determining said lower threshold level.

11. The method of claim 10 including the step of determining the average value of the AC ripple voltage that appears across said one and said at least one additional one of said backup batteries and of setting said lower threshold level based upon said average value minus a first additional amount.

12. The method of claim 11 including the step of setting said first additional amount into a memory that is used by a microprocessor.

13. The method of claim 11 including the step of adjusting the position at least one switch to establish the magnitude of said first additional amount.

14. The method of claim 9 including the step of determining said upper threshold level.

15. The method of claim 14 including the step of determining the average value of the AC ripple voltage that appears across said one and said at least one additional one of said backup batteries and of setting said upper threshold level based upon said average value plus a second additional amount.

16. The method of claim 15 including the step of setting said second additional amount into a memory that is used by a microprocessor.

17. The method of claim 15 including the step of adjusting the position at least one switch to establish the magnitude of said second additional amount.

18. A method of detecting a decrease in the efficacy of any of a plurality of backup batteries that are normally charged by the output of a rectifier and are electrically connected in series, which comprises:
   (a) measuring the AC ripple voltage across one of said backup batteries;
   (b) comparing the measured AC ripple voltage with a lower threshold level and if the AC ripple voltage falls below said lower threshold level, including the step of determining if said backup batteries are supplying the electrical power to the load and, if said backup batteries are not supplying said electrical power to the load, including the step of generating an electrical signal for activating an alarm to indicate that a failure of at least one of said backup batteries has occurred;
   (c) comparing the measured AC ripple voltage with an upper threshold level and if the AC ripple voltage rises above said upper threshold level, including the step of generating an electrical signal for activating an alarm to indicate that a failure of at least one of said backup batteries has occurred.

19. An apparatus for detecting a decrease in the efficacy of any of a plurality of backup batteries connected in series that are used to supply electrical power to a load in the event of an interruption of an AC electrical input power source which normally supplies said load and maintains said backup batteries in a state of ready charge, comprising:
   (a) means for measuring an AC ripple voltage across at least one of any of said backup batteries;
   (b) means for comparing said AC ripple voltage across at least one of any of said backup batteries to a maximum threshold value and in the event said AC ripple voltage rises above said maximum threshold value, including the activation of means for generating an alarm indication;

(c) means for generating a signal responsive to when said backup batteries are supplying said electrical energy for said load; and (d) means for comparing said AC ripple voltage across at least one of any of said backup batteries to a minimum threshold value and in the event said AC ripple voltage falls below said minimum threshold value and said means for generating a signal is inactive, including the activation of said means for generating an alarm indication.

20. The device of claim 19 including a microprocessor and means for establishing said maximum threshold value and said minimum threshold value.

* * * * *